United States Patent [19]
Ackerman et al.

[11] Patent Number: 5,111,475
[45] Date of Patent: May 5, 1992

[54] ANALOG OPTICAL FIBER COMMUNICATION SYSTEM, AND LASER ADAPTED FOR USE IN SUCH A SYSTEM

[75] Inventors: David A. Ackerman, Hopewell; Leonard J. Ketelsen, Fanwood; Louis A. Koszi, Scotch Plains, all of N.J.

[73] Assignee: AT&T Bell Laboratories, Murray Hill, N.J.

[21] Appl. No.: 672,306

[22] Filed: Mar. 20, 1991

Related U.S. Application Data

[63] Continuation-in-part of Ser. No. 459,922, Jan. 2, 1990, Pat. No. 5,012,484.

[51] Int. Cl.$^5$ .............................................. H01S 3/08
[52] U.S. Cl. ....................................... 372/96; 372/45; 372/50; 385/15
[58] Field of Search ...................... 372/44, 45, 96, 50; 385/15

[56] References Cited

U.S. PATENT DOCUMENTS

| | | | |
|---|---|---|---|
| 4,749,255 | 6/1988 | Chakrabarti et al. | 350/164 |
| 4,905,253 | 2/1990 | Chraplyvy et al. | 372/96 |
| 5,012,484 | 4/1991 | Flynn et al. | 372/96 |

FOREIGN PATENT DOCUMENTS 0092588  5/1984  Japan ...................................... 372/96

OTHER PUBLICATIONS

Olshansky, R. et al., "60-Channel FM Video Subcarrier Multiplexed Optical Communication System," *Elect. Letts.*, vol. 23, No. 22, 1987-Oct., pp. 1196-1197.

Eda, N. et al., "Axial Mode Selectivity in Active Distributed-Reflector for Dynamic-Single-Mode Lasers," *J. Lightwave Tech.*, vol. LT3, No. 2, Apr. 1985, pp. 400-407.

Wu, H. et al., "Linewidth Broadening due to Longitudinal Spatial Hole Burning in a Long Distributed Feedback Laser," *Appl. Phys. Letts.*, vol. 52, No. 14, pp. 1119-1121, Apr. 1988.

Westbrook, L. D. et al., "Spectral Properties of Strongly Coupled 1.5 μm DFB Laser Diodes," *IEEE J. Quantum Elect.*, vol. QE-21, No. 6, Jun. 1985, pp. 512-518.

Henry, C. H., "Performance of Distributed Feedback Lasers Designed to Favor the Energy Gap Mode," *IEEE J. Quantum Elect.*, vol. QE-21, No. 12, Dec. 1985, pp. 1913-1918.

Soda, H. et al., "Stability in Single Longitudinal Mode Operation in GaInAsP InP Phase-Adjusted DFB Lasers," *IEEE J. Quantum Elect.*, vol. QE-23, No. 6, 804-814 Jun. 1987.

Utaka, K. et al. "λ/4-Shifted InGaAsP/InP DFB Lasers," *IEEE J. Quantum Elect.*, vol. QE-22, No. 7, pp. 1042-1051 Jul. 1986.

(List continued on next page.)

*Primary Examiner*—Georgia Epps
*Attorney, Agent, or Firm*—E. E. Pacher

[57] ABSTRACT

Lasers for use in multichannel analog optical fiber communication systems (e.g., of the type contemplated for CATV) have to meet very stringent requirements, including high linearity. DFB lasers are advantageously used in such communication systems. Typically only a relatively small percentage of the nominally identical DFB lasers on a wafer meet the specifications. It has now been discovered that the likelihood that a given DFB laser will meet the requirements is substantially increased if the laser comprises means that are adapted for producing a non-uniform photon density in the laser cavity, with the density of photons being larger in the rear portion of the cavity than in the front portion, such that during operation of the laser the gain in the back portion is substantially independent of the laser current, whereas the gain in the front portion is a function of the laser current. A particular embodiment of the invention is a "bare patch" DFB laser having a grating that extends only part way from the front facet towards the back facet, such that a portion of the laser cavity does not have the grating associated therewith. The design ensures that the proper photon density is established within the laser cavity with high probability, largely independent of the rear (HR) facet reflection phase.

5 Claims, 4 Drawing Sheets

OTHER PUBLICATIONS

Kotai, Y. et al., "High-Efficiency Operation of Phase-Adjusted DFB Laser by Asymmetric Structure," *Elect. Letts.*, vol. 22, No.9, pp. 462–463 Apr. 1986.

Favre, F., "Design of Asymmetric Quarter-Wave-Shifted DFB Semiconductor Lasers," *Elect. Letts.*, vol. 22, No. 21, 1986-Oct., pp. 1113–1114.

McCall, S. L. et al., "An Optimized $\pi/2$ Distributed Feedback Laser," *IEEE J. Quantum Elect.*, vol. QE-21, No. 12, pp. 1899–1904, Dec. 1985.

Zilko, J. L. et al., "Growth and Characterization of High Yield, Reliable, High-Power, High-Speed, InP-/InGaAsP Capped Mesa Buried Heterostructure Distributed Feedback (CMBH-DFB) Lasers," *IEEE J. Quantum Elect.*, vol. 25, No. 10, pp. 2091–2095, Oct. 1989.

Kuo, C. Y. et al., "Frequency Modulation Responses of Two-Electrode Distributed Feedback Lasers," *Appl. Phys. Lett.*, vol. 55, No. 13, pp. 1279–1281, Sep. 1989.

ANALOG OPTICAL FIBER COMMUNICATION SYSTEM, AND LASER ADAPTED FOR USE IN SUCH A SYSTEM

CROSS REFERENCE TO RELATED APPLICATION

This application is a continuation-in-part of our co-pending application Ser. No. 459,922, filed Jan. 2, 1990 U.S. Pat. No. 5,012,484.

FIELD OF THE INVENTION

This invention pertains to optical multichannel analog communications systems, and to semiconductor lasers adapted for use in such systems.

BACKGROUND OF THE INVENTION

The concept of transmitting several television channels through optical fiber using analog intensity modulation of the output of a semiconductor laser diode has recently been receiving considerable attention. As proposed in the prior art, this would involve transmission of multi-channel amplitude modulated-vestigial side band (AM-VSB) signals, as used in present day cable television (CATV) systems, in an optical fiber transmission medium. Such an arrangement would be useful in a CATV trunk system or in a fiber-to-the-home network. Optical fiber transmission systems that use frequency division multiplexing overcome compatibility problems and have advantages such as simplicity of design, reduced bandwidth requirements for lightwave components, and much lower costs, as compared with optical time division multiplex (TDM) systems.

The wide bandwidths of semiconductor laser diodes and optical fibers make analog sub-carrier modulation an attractive technology. Several signals at different sub-carrier frequencies, each signal representing one of the television channels to be multiplexed, are summed and applied concurrently to the input of the laser device. The input information signal is a set of frequency-modulated sub-carriers at different frequencies, e.g., frequencies $\omega_0, \omega_1, \omega_2, \ldots$. The resulting laser injection current comprises a dc bias level plus the set of frequency-modulated sub-carrier signals. The magnitude of the optical output power from the laser fluctuates with the magnitude of the laser injection current. The resulting sub-carrier frequency division multiplexed (FDM) optical output signal is applied to an optical fiber for transmission over an extended distance. After transmission through the fiber the optical signal is detected by appropriate means, e.g., a PIN diode, and the resulting electrical signal is processed by conventional means to recover the individual signals. See, for instance, R. Olshansky et al., *Electronics Letters*, Vol. 23(22), pp. 1196-1197 (1987).

Multi-channel amplitude modulated signal transmission requires special limitations on the power, the nonlinearity, and the intensity noise of the transmitting laser diode. For adequate system performance, laser output light intensity must be a very nearly linear function of the laser drive current under large-signal modulation. Strict limitations on laser nonlinearity are required because of the wide dynamic range of the National Television Systems Committee (NTSC) standard video format. Exemplarily, in the NTSC standard video format, the ratio of the magnitude of the carrier to the magnitude of the total third order intermodulation distortion products at the carrier frequency must be less than −60 dBc. Similarly, the peak second-order distortion, i.e., the sum of several tens of two-tone products (or the ratio of the carrier to the largest composite second-order peak), must be less than −60 dBc. To obtain such high signal quality in view of the large number of distortion products, the transmitting laser light-versus-current characteristic must be extremely linear.

In a system that uses frequency division multiplexing any nonlinearity in the laser diode characteristic will result in intermodulation noise. Laser nonlinearities create energy transfers from the applied sub-carrier frequencies to, among others, those frequencies that are the sum and difference frequencies of all of the pairs of applied signal frequencies. Such energy transfers cause undesirable intermodulation distortion and interference, both of which can limit the performance of the transmission system.

There are several known causes of nonlinearity in semiconductor laser diodes. Some of the causes of nonlinearity are high frequency relaxation oscillations, low frequency heating effects, damping mechanisms, optical modulation depth, leakage current, gain compression, and nonlinear absorption. The resulting effect of the distortion and interference is a degradation in the signal-to-noise ratio for the signal, as received further along in the system.

An experimental sub-carrier frequency division multiplexed, optical communication system having sixty frequency-modulated channels in the 2 GHz to 8 GHz band has been operated with a 56 dB weighted signal-to-noise ratio. Other arrangements using microwave carriers for subscriber loop transmission have put (1) five frequency-modulated video channels in the 150 MHz to 300 MHz band and (2) ten frequency-modulated video channels in a C-band satellite signal in the 4.9 GHz to 5.2 GHz band.

The currently most attractive scheme for multiplexing multiple video channels onto a continuous-wave laser output involves amplitude modulated-vestigal sideband signal multiplexing. Some previously available semiconductor lasers can exhibit distortions approaching the required low levels. However, typically only a small fraction of a given batch of otherwise suitable lasers meet the distortion requirements, requiring extensive noise measurements to identify those lasers that have sufficiently low distortion. U.S. patent application Ser. No. 420,867 U.S. Pat. No. 5,034,334, incorporated herein by reference, discloses a method of producing lasers that includes a simple technique for identifying lasers that will have low distortion and thus may be suitable for use in a multichannel analog fiber communication system. Such a system is disclosed in U.S. patent application Ser. No. 420,849, U.S. Pat. No. 5,020,049 also incorporated herein by reference.

However, even though there now exists a method that permits easy identification of lasers that have low distortion, the number of lasers on a given wafer that have requisite low distortion typically is quite low. Such low yield of course is highly undesirable since it results in relatively high unit cost of acceptable lasers. A laser design that can result in increased yield of low distortion lasers thus would have substantial economic significance. This application discloses a distributed feedback (DFB) laser having novel design features that can result in increased yield of lasers acceptable for use in multichannel analog communication systems.

Various aspects of DFB laser design have previously been considered with a view towards optimizing performance of such lasers in digital applications, including coherent optical fiber transmission systems. This work generally aimed at, inter alia, relatively high slope efficiency ("slope efficiency" is defined herein as the maximum value of dL/dI of the laser, where L is the radiation output power at the front facet of the laser, and I is the laser drive current) and, consequently, relatively high output power asymmetry between the front and back facets of the lasers. Other important design criteria for digital laser applications include spectral purity (or "side mode suppression ratio"), chirp, and linewidth. To optimize the performance of devices in these respects the use of various facet coatings and phase shifts have been considered.

For instance, N. Eda et al., *J. of Lightwave Technology*, Vol. LT-3(2), pp. 400–407 (1985) show that the optimal value of the coupling parameter KL for a AR/AR phase shifted DFB laser is about 2, and suggest use of a lower value of K in the front of the laser to improve the front facet output efficiency (K is the grating coupling constant and L is the length of the laser "cavity", i.e., the distance between the front and back facets. By "AR/AR" is meant that the laser has both facets anti-reflection coated).

H. Wu et al., *Applied Physics Letters*, Vol. 52(14), pp. 1119–1121 (1988), discloses that in AR/AR DFB lasers relatively large values of KL lead to line broadening, and also discloses that a HR/AR laser has a more uniform field distribution than a AR/AR laser, resulting in reduced longitudinal spatial hole burning. ("HR" designates a facet with high reflection coating). On the other hand, L. D. Westbrook et al., *IEEE J. of Quantum Electronics*, Vol. QE-21(6), pp. 512–518 (1985), discuss the experimental determination of KL and report observation of narrow linewidths even for relatively large (e.g., 2, 4 and 4.8) values of KL.

C. H. Henry, *IEEE J. of Quantum Electronics*, Vol. QE-21(12), pp. 1913–1918 (1985) shows that in a HR/AR DFB laser KL of about 1 is optimal, and $KL \lesssim 2$ is needed in order to attain high mode selectivity and quantum efficiency, and good insensitivity to reflections.

H. Soda et al., *IEEE J. of Quantum Electronics*, Vol. QE-23(6), pp. 804–814 (1987) give experimental results for AR/AR phase-shifted DFB lasers, and disclose that moderate coupling (KL~1.25) is optimum to maintain high mode selectivity above threshold. The phase-shift was symmetrically placed. Best yield of acceptable lasers was also obtained for KL of about 1.25.

K. Utaka et al., *IEEE J. of Quantum Electronics*, Vol. QE-22(17), pp. 1042–1051 (1986), teaches that in AR/AR phase shifted DFB lasers placement of the phase-shift toward the front facet of the cavity improves efficiency of power extraction, and the optimum structure in terms of wavelength selectivity is one having the phase-shift at the center of the cavity, with both end reflectivities being zero.

Y. Kotai et al., *Electronics Letters*, Vol. 22, pp. 462–463 (1986) teach that the output power asymmetry can be enhanced by placing the phase-shift near the front of the laser. See also F. Favre, *Electronics Letters*, Vol. 22(21), pp. 1113–1114 (1986), and S. McCall et al., *IEEE J. of Quantum Electronics*, Vol. QE-21(12), pp. 1899–1904 (1985).

THE INVENTION

In a broad aspect the invention is a multichannel analog optical fiber communication system that comprises a semiconductor laser having novel design features. The system comprises transmitting means, receiving means, and a length of optical fiber, signal-transmissively connecting the transmitting means and the receiving means. The transmitting means comprise a semiconductor laser according to the invention, having features that are discussed below.

The operation of the system comprises causing a current of predetermined value to flow through the laser, and varying the current in response to an external signal, such that L varies in response to the external signal. In general the current has a dc component corresponding to the operating point of the diode on the L-I curve, and an ac component superimposed on the dc component. The operating point is selected at or near the current value (herein designated $I_{op}$) at which dL/dI is a maximum. Operating the laser at or near $I_{op}$ can result in relatively low signal distortion, in particular, relatively low second order distortion, and makes it possible to meet the very stringent specifications that are deemed necessary for successful operation of multichannel analog fiber CATV trunk transmission systems under current consideration.

In a further broad aspect the invention is a semiconductor laser having novel design features. These features can increase the likelihood that a given laser will have characteristics such that it is acceptable for use in a multichannel analog fiber communication system. Of course, lasers according to the invention are expected to find advantageous use also in other applications that can benefit from low distortion, and all such uses are contemplated.

More particularly, lasers according to the invention comprise a semiconductor body that forms a laser cavity of length L that is defined by a front facet and a back facet (the "front" of the cavity is the side from which the useful radiation is emitted, and the "back" is the opposite side). Associated with each of the facets is a reflectivity, and associated with the cavity (and any given portion thereof) is, during operation of the laser, a photon density and a gain (by "operation" of the laser we mean above-threshold operation). Lasers according to the invention also comprise a grating or other means for providing distributed feedback, and further comprise contact means that facilitate flowing an electrical current through the semiconductor body.

The lasers furthermore comprise means adapted for producing, during operation of the laser, a non-uniform photon density in the cavity, the density of photons being larger in the back portion of the cavity than in the front portion (the "back portion" of the cavity herein is the portion that is adjacent to the back facet, and the "front portion" is the remainder of the cavity. The length of the back portion typically is in the approximate range L/4 to 3 L/4, exemplarily about L/2). The non-uniform photon density is such that, during operation of the laser, the gain in the back portion of the cavity is substantially independent of the current through the semiconductor body, whereas the gain in the front portion of the cavity is a function of the current through the semiconductor body. Such a non-uniform photon distribution substantially enhances the likelihood that a laser according to the invention has a value of $I_{op} - I_{th}$ greater than some pre-determined value, e.g., greater than 10 mA. ($I_{th}$ here is the laser threshold current, i.e., the device current at which the transition to laser oscillation occurs). A relatively high value of the parameter $I_{op}-I_{th}$ signifies that the laser is likely to have relatively high output power at $I_{op}$, and therefore is likely to be acceptable for use in a multi-channel analog optical fiber communication system, or other application that requires a laser that exhibits low distortion at a relatively high output level.

Those skilled in the art know that DFB lasers typically have a longitudinally varying photon distribution. See, for instance, M. Wu et al, (op. cit.). However, the exact location of the peak in the distribution depends on the phase of the wave at the laser facets. This phase is substantially uncontrollable and therefore typically randomly distributed, resulting in wide variation of the location of the peak between lasers, even nominally identical lasers from a given wafer. We have discovered that, by incorporating into the laser design means that tend to position the peak of the photon distribution in the back portion of the laser cavity, yield of acceptable lasers can be substantially improved.

A possible reason for the observed yield improvement is as follows. If the photon density above threshold is high in the back portion of the cavity, then the gain in that portion of the cavity is "clamped" near the threshold gain. On the other hand, the photon density in the front portion of the cavity being relatively low, the gain in the front portion increases above its threshold value as the drive current is increased above $I_{th}$. This increasing gain is believed to effectively increase the slope efficiency (the maximum value of $dL/dI$) of the laser. The value of $I_{op}-I_{th}$ is directly related to the degree to which the front of the laser cavity is disconnected from the back, and the degree to which the gain in the front part is "unclamped". Thus, by providing means that favor gain clamping in the back part of the laser and unclamped gain in the front, the likelihood that a given laser has a relatively large value of $I_{op}-I_{th}$ (and thus is a likely candidate for use in a multichannel analog optical fiber communication system) is substantially increased over prior art lasers.

The above theoretical discussion is included for tutorial purposes only and is not intended to limit the invention.

Departing from prior art practice which generally aimed at increased laser power asymmetry and high slope efficiency in lasers for high bit rate communication systems, we have discovered that the yield of lasers acceptable for use in multichannel analog communication systems can be substantially increased if the lasers are designed to have relatively low (less than 5 or even 4) asymmetry. "Laser power asymmetry" is defined herein as the ratio of front facet power to back facet power, determined at a front facet power of 4 mW. As a consequence of the novel requirement of relatively low asymmetry, in a collection of lasers of nominally identical parameters, the lasers that are typically most suitable for use in the referred to analog communication systems have relatively low slope efficiency. Those skilled in the art will recognize that there are design features that affect slope efficiency but essentially do not effect asymmetry.

We have identified several means for producing the desired non-uniform photon distribution, and still others may be discovered later. These means can be used singly or in various combinations, as may be required by a particular application. However, lasers according to the invention typically will be relatively strongly coupled AR/HR DFB lasers (i.e., having an antireflection coated front facet and a high reflection coated back facet, with KL greater than about 1.6, typically in the range 1.6-2.5, with values of about 2 being currently preferred). It will be recognized that the prior art frequently aimed at values of KL$\lesssim$1.5 in distributed feedback (DFB) lasers for communications use. See, for instance, C. H. Henry, (op. cit.).

The means adapted for producing the desired photon distribution also include a grating feature (conventionally called a phase shift) located in the part of the grating that is associated with the back portion of the cavity. The feature typically is an appropriate grating discontinuity. In prior art lasers phase shifts typically were placed at the mid-point of the grating, or in the front portion of the cavity. This typically was done in combination with AR/AR coatings to maximize the spectral purity. The prior art phase shifts do not favor high photon density in the back portion of the cavity.

Other means that favor the desired non-uniform photon distribution include split contact means, with one part of the split means being associated with the back portion of the cavity and another part being associated with the front portion of the cavity, such that the currents through the back and front portions of the cavity can be separately controlled. Still other means are structure means that have the effect of causing the gain in the front portion of the cavity to be relatively high, as compared to the gain in the back portion. Exemplary of such structure means is a cavity of non-constant width, with at least a part of the front portion of the cavity being wider than the back portion.

BRIEF DESCRIPTION OF THE DRAWINGS

No attempt has been made to show true dimensions and/or proportions. Analogous features in different figures are designated by the same reference numerals.

DETAILED DESCRIPTION OF SOME CURRENTLY PREFERRED EMBODIMENTS

Figure 1:
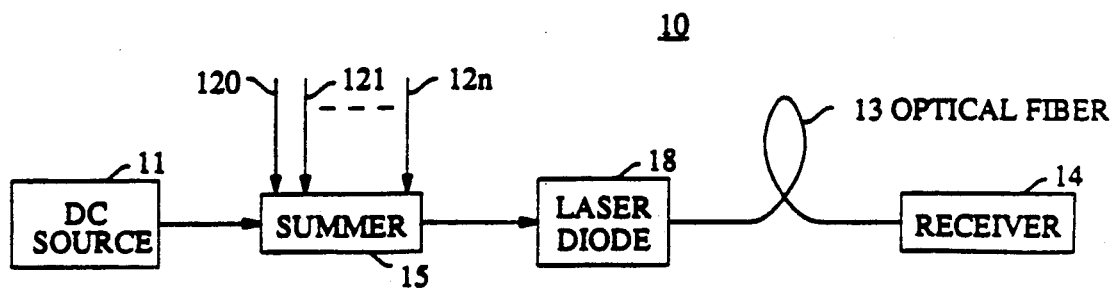
FIG. 1 is a block diagram of an exemplary system according to the invention, namely, a multi-channel sub-carrier multiplexed amplitude modulated optical communication system, comprising a laser according to the invention.

FIG. 1 schematically depicts an exemplary amplitude modulated-vestigial sideband signal sub-channel multi-plexed optical transmission system 10. Several baseband frequency modulation television channel signals 120, 121, 122, ... 12n are frequency division multiplexed on different carrier frequencies $\omega_0, \omega_1, \omega_2 ... \omega_n$, (with n typically substantially greater than 10, e.g., about 40) as separate amplitude modulated-vestigial sideband signal sub-channels in a composite multiplex signal. A summer 15 combines the individual channel signals at the different sub-channel frequencies and a dc bias current $I_{op}$ from dc source 11 into the composite multiplex signal. This composite multiplex signal is applied to inventive laser diode 18 as the laser drive input signal.

The total laser input drive signal, or injection current, to the laser diode 18 includes both the dc bias component $I_{op}$ and the composite multiplex signal from the summer 15. The channels typically are equally spaced in frequency, with the frequency width of each channel typically being in the range from 10–550 MHz, the bandwidth typically depending, inter alia, on the nature of the signal that is to be transmitted. The output of the laser generally is in the visible or near infrared portion of the spectrum, exemplarily in the approximate range 0.8–1.6 $\mu$m. Currently preferred are wavelengths of about 1.3 and 1.55 $\mu$m, corresponding to the transmission "windows" of currently available $SiO_2$-based optical fibers. The output radiation is coupled into optical fiber 13, and transmitted therethrough to receiver 14.

DFB lasers are well known in the art and need no detailed discussion. See, for instance, J. L. Zilko et al., *IEEE J. of Quantum Electronics*, Vol. 25(10), pp. 2091–2095 (1989), incorporated herein by reference. Methods of producing a phase-shift (typically a $\lambda/4$ shift) are also known. See, for instance, K. Utaka, (op. cit.), incorporated herein by reference. Furthermore, those skilled in the art know techniques for applying AR coatings (typically reflectivity less than about 2%) and HR coatings (typically reflectivity greater than about 30%) to laser facets. Herein we consider a laser to be AR/HR if the ratio of front facet reflectivity to back facet reflectivity is less than about 5%.

Figure 2:
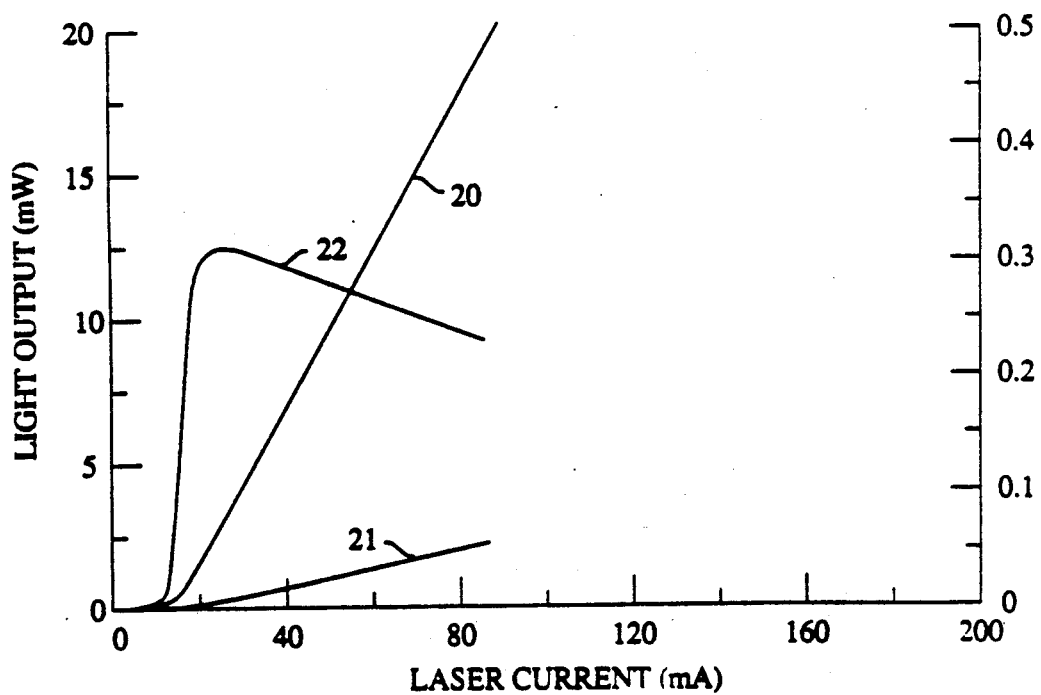
FIG. 2 shows an exemplary curve of light output intensity L versus laser injection current I, and also shows L', the first derivative of L with respect to I, all for a laser that has high asymmetry and relatively small value of $I_{op}-I_{th}$.

FIG. 2 shows data obtained from a laser that is not considered acceptable for use in a multichannel analog communication system, but that is potentially useful for a digital communication system. In particular, curve 20 is the front facet output power, curve 21 is the back facet output power, and curve 22 is the first derivative of 20 with respect to the drive current. The laser had a relatively high value of laser power asymmetry (7.8), relatively low value of $I_{op}-I_{th}$ (8 mA), and relatively high slope efficiency (0.32 mW/mA).

Figure 3:
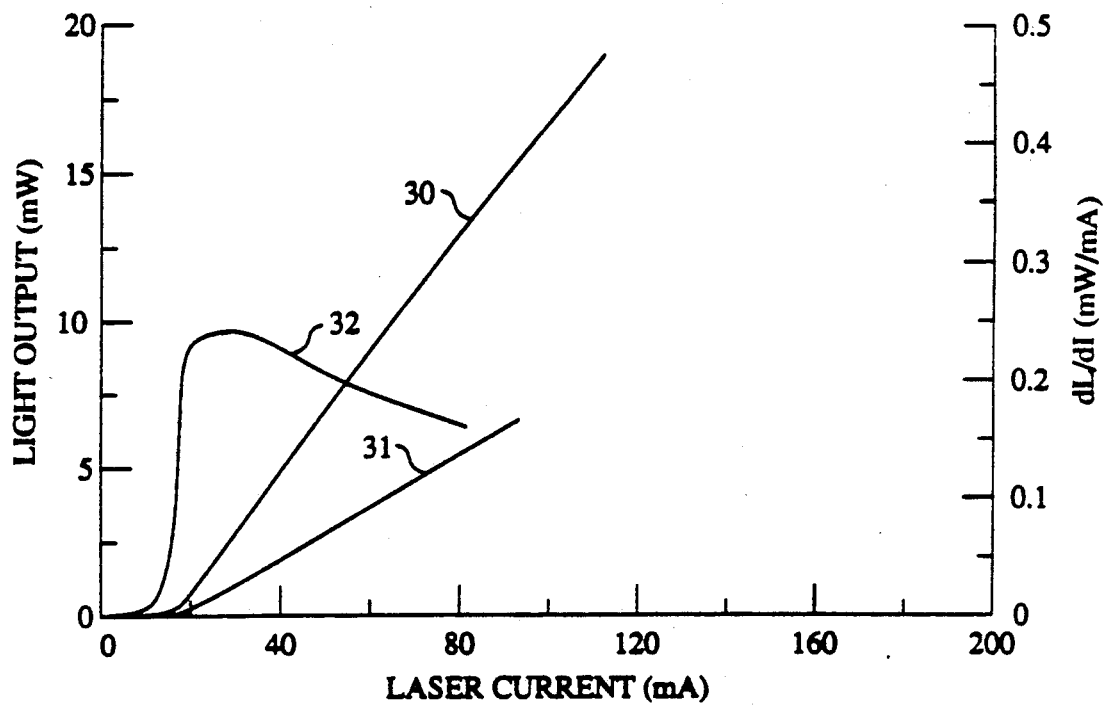
FIG. 3 shows the same parameters as shown in FIG. 2, but for a laser according to the invention that has low asymmetry and a relatively large value of $I_{op}-I_{th}$, and thus is a candidate for use in the inventive system.

FIG. 3 shows data from a laser according to the invention that is acceptable for use in a multichannel analog communication system. Curves 30, 31, and 32 are the front facet output power, back facet output power, and the first derivative of the front facet output power, respectively. The laser has relatively low power asymmetry (2.3) and relatively high value of $I_{op}-I_{th}$ (17 mA). It also has relatively low slope efficiency (0.24 mW/mA).

The laser of FIG. 3 is a CMBH-DFB laser of the type described by J. L. Zilko et al., (op. cit.). The laser had a 65% HR coating and a (<1%) AR coating and KL of about 1.8.

Figure 4:
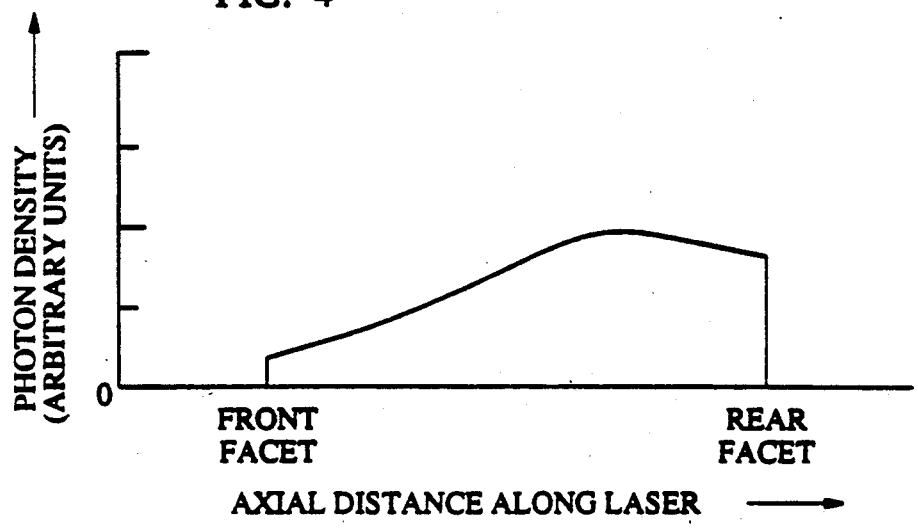
FIG. 4 schematically depicts the photon distribution in an exemplary laser according to the invention.

Lasers according to the invention optionally comprise one or more additional features that can enhance the likelihood that a given laser has the desired non-uniform photon distribution and thus is likely to be acceptable for use in an analog communication system. An exemplary non-uniform photon distribution according to the invention is schematically depicted in FIG. 4.

Figure 5:
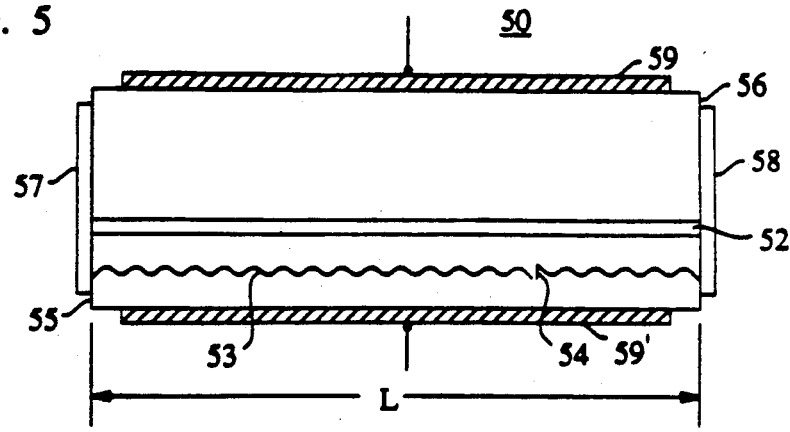
FIGS. 5-8 schematically show exemplary lasers according to the invention.

One feature adapted to enhance the likelihood of obtaining the desired non-uniform photon distribution is a phase shift (typically by $\lambda/4$) in the back portion of the grating, i.e., in the part of the grating that is associated with the back portion of the cavity. A phase shift allows the lasing mode to be concentrated about the phase shift. Locating the phase shift in the back portion of the grating can greatly increase the probability that the laser has a "sweet spot" (and has $I_{op}$ much greater than $I_{th}$), and is contrary to prior art practice, which places the phase shift into the center or the front portion of the grating. FIG. 5 schematically depicts a AR/HR laser (50) with a phase shift located approximately 3 L/4 from the front facet. The semiconductor body comprises active region 52 and grating 53, with the latter comprising $\lambda/4$ phase shift 54. The front facet 55 is (completely or partially) covered with AR coating 57 and back facet 56 is (completely or partially) coated with HR coating 58. The laser also comprises conventional contacts 59 and 59'.

Figure 6:
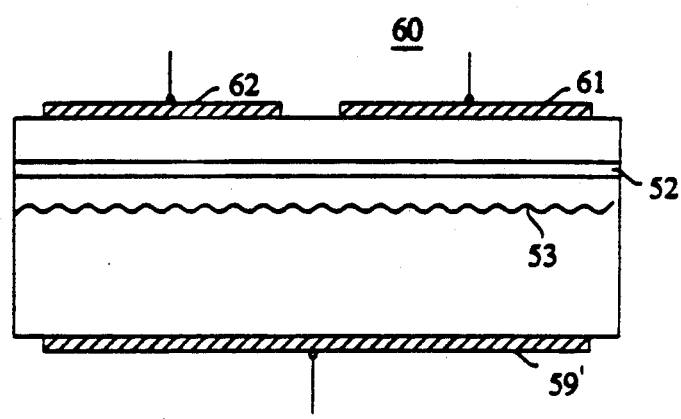

Another such feature is separate contacts for the front portion and the back portion of the laser, such that the current density through the front portion is separately controllable from that through the back portion. FIG. 6 schematically shows laser 60 which comprises split contact means 61 and 62. It will be understood that such a laser may optionally comprise facet coatings and/or a phase shift (not shown).

By appropriately dividing the drive current between the front and back portions of the laser, it is possible to insure that the back portion reaches threshold first. Assuming that the facet phases of a given laser are appropriate, such current control can be used to enforce a "sweet spot" or to increase the value of $I_{op}-I_{th}$. As those skilled in the art will recognize, a current divider can be integral to the laser, or the division can be caused by external means. Also, they will recognize that the division can be in a fixed ratio or be some more complicated function. As the limiting case of the divided current, a laser can have an unpumped front portion.

Figure 7:
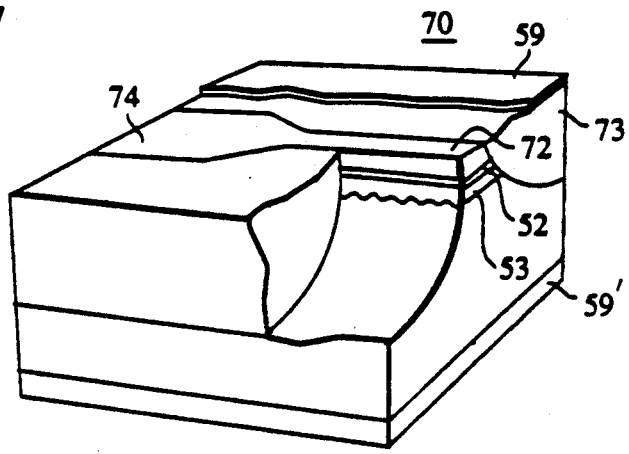

A still further feature is structural means that cause the gain in the front portion of the laser to be relatively low, as compared to the gain in the back portion. Exemplary structural means are a non-constant mesa width, with the front portion of the mesa being wider than the back portion. The change in width can be gradual or abrupt. FIG. 7 schematically depicts an exemplary laser 70 with non-constant mesa width. The semiconductor body comprises active region 52 and grating 53, both being part of mesa 72. The body also comprises semi-insulating current blocking material 73. The mesa is etched to comprise a relatively narrow portion adjacent to the rear facet and a relatively wide portion 74. Facet coatings are not shown.

Figure 8:
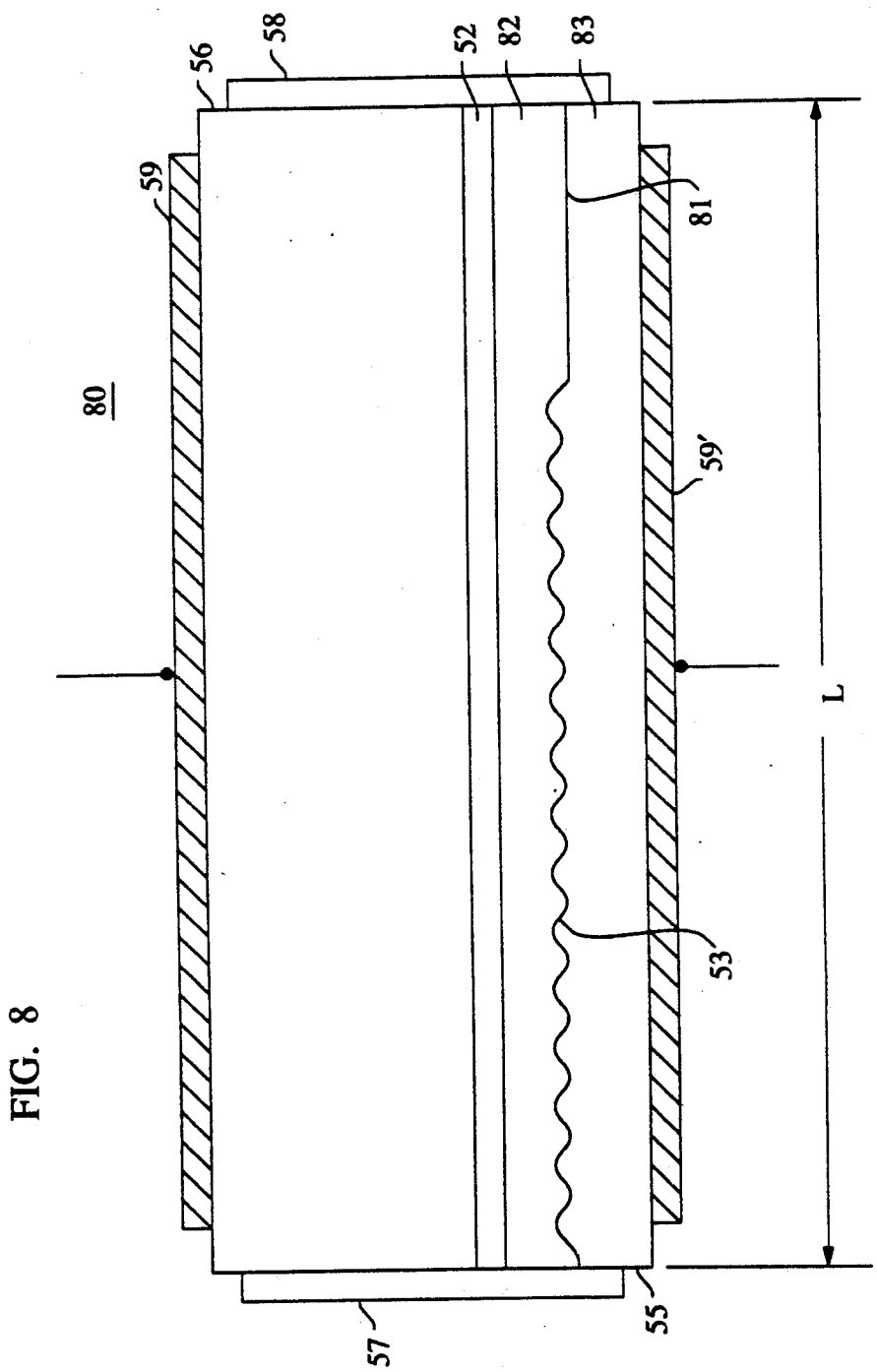

A yet further embodiment of the invention can be called the "bare patch" laser. Such a laser (80) is schematically depicted in FIG. 8. The "bare patch" extends a distance $\delta L$ from the back facet towards the front facet. Exemplarily, a laser according to this embodiment of the invention has cavity length 250 $\mu$m, $\delta L \sim 75$ $\mu$m $\pm 30$ $\mu$m, front facet (AR) reflectivity <1%, back facet (HR) reflectivity of about 65%, and coupling constant K of about $100 \pm 20$ cm$^{-1}$.

Those skilled in the art will recognize that bare patch lasers are relatively easy to manufacture and can have a highly non-uniform photon distribution. Furthermore, in bare patch lasers the photon density is largely independent of the phase of the HR facet reflection. This is a very advantageous feature, as those skilled in the art will also recognize. Exemplarily, a bare patch laser can be manufactured substantially like the embodiment of FIG. 5, except that the grating mask does not comprise a λ/4 phase shift, and in that the surface portion of 83 that corresponds to the bare patch is uniformly etched.

EXAMPLE 1

A multiplicity of CMBH DFB lasers was produced substantially as described by Zilko et al. (op. cit.). The grating depth and device length were chosen to result in KL of about 1.8. Yttria stabilized zirconia coatings were applied to the facets, substantially as described in U.S. Pat. No. 4,749,255 (which is incorporated herein by reference). The coating parameters were selected to result in an AR coating (<1% reflectivity) on the front facets and a HR coating (about 65% reflectivity) on the back facets. Conventional electrodes were applied in a conventional manner, and a variety of measurements were carried out on the devices. The measurements indicate that the multiplicity of lasers according to the invention contained a higher percentage of lasers adapted for use in a multichannel analog optical fiber communication system than is present in an analogous sample of prior art CMBH DFB AR/AR lasers that have KL<1.6. FIG. 3 shows measurement results from a representative member of the multiplicity of lasers. The measurements in their totality indicate that the lasers that met the specifications for the communication system had a non-uniform photon density, with the density being larger in the back portion of the cavity than in the front portion.

EXAMPLE 2

A multiplicity of lasers is produced substantially as described in Example 1, except that a λ/4 phase shift is introduced into the grating in a manner substantially as taught by Utaka et al. (op. cit.). Lithography conditions are chosen to result in a phase shift location about 3 L/4 from the front facet. Measurements carried out on the multiplicity of lasers yield results similar to those carried out on the lasers of Example 1.

EXAMPLE 3

A multiplicity of lasers is produced substantially as described in Example 1, except that the p-side electrode is a symmetrically split electrode. The split electrode is produced by lithography and etching techniques that are well known in the art. Electrical isolation between the front and back electrode segments of 2-5 kΩ was achieved by means substantially as described by C. Y. Kuo et al., *Applied Physics Letters*, Vol. 55(13), pp. 1279-1281 (1989). Injection of independent currents through the two electrode segments of a given laser made it possible to clamp the gain in the back portion of the cavity while at the same time having unclamped gain in the front portion. Measurements carried out on the multiplicity of lasers yield results similar to those carried out on the lasers of Example 1.

EXAMPLE 4

A multiplicity of lasers is produced substantially as described in Example 1, except that a mask set is used that is appropriately modified to result in mesas of the type schematically shown in FIG. 7. Conventional lithography and etching are used to produce the mesas, with the front portion of a given mesa being about double the width of the back portion. This geometrical feature results in increased gain in the front portion of the cavity, with the gain in that portion being dependent on the laser current. Measurements carried out on the multiplicity of lasers yield results similar to those carried out on the lasers of Example 1.

We claim:

1. A semiconductor laser comprising
   a) a semiconductor body forming a radiation cavity of length L defined by a front facet and a back facet, associated with each of said facets being a reflectivity, and associated with the cavity during operation of the laser being a photon density and a gain;
   b) a diffraction grating associated with the radiation cavity; and
   c) contact means facilitating flowing an electrical current through the semiconductor body;
   CHARACTERIZED IN THAT
   d) said diffraction grating has a length that is less than L, such that a portion of the radiation cavity does not have a diffraction grating associated therewith, said portion extending from the back facet for a distance δL towards the front facet, and the radiation cavity extends continuously, without off-set, between the front and back facets.

2. The laser of claim 1, wherein the grating has length L-δL, L is about 250 μm and δL is about 75 μm.

3. The laser of claim 1, comprising a high reflection coating on the back facet and an antireflection coating on the front facet, and furthermore comprising a diffraction grating selected such that KL is in the approximate range 1.6-2.5, where K is the grating coupling constant.

4. Multichannel analog optical fiber communication system comprising transmitting means, receiving means, and a length of optical fiber signal-transmissively connecting the transmitting means and the receiving means, the transmitting means comprising at least one laser that comprises
   a) a semiconductor body forming a radiation cavity of length L defined by a front facet and a back facet, associated with each of said facets being a reflectivity, and associated with the cavity during operation of the laser being a photon density and a gain;
   b) a diffraction grating associated with the radiation cavity; and
   c) contact means facilitating flowing an electrical current through the semiconductor body;
   CHARACTERIZED IN THAT
   d) said diffraction grating has a length that is less than L, such that a portion of the radiation cavity does not have a diffraction grating associated therewith, said portion extending from the back facet for a distance δL towards the front facet, and the radiation cavity extends continuously, without off-set, between the front and back facets.

5. The communication system of claim 4, wherein the laser comprises a high reflection coating on the back facet and an antireflection coating on the front facet, and furthermore comprises a diffraction grating selected such that KL is in the approximate range 1.6-2.5, where K is the grating coupling constant.

* * * * *